(12) United States Patent
Park et al.

(10) Patent No.: US 12,507,363 B2
(45) Date of Patent: Dec. 23, 2025

(54) WINDOW AND DISPLAY DEVICE INCLUDING THE SAME

(71) Applicant: Samsung Display Co., LTD., Yongin-si (KR)

(72) Inventors: Youngsang Park, Yongin-si (KR); Sungguk An, Yongin-si (KR); Jang Doo Lee, Yongin-si (KR); Chul Ho Jeong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 225 days.

(21) Appl. No.: 18/232,914

(22) Filed: Aug. 11, 2023

(65) Prior Publication Data

US 2024/0107696 A1    Mar. 28, 2024

(30) Foreign Application Priority Data

Sep. 20, 2022 (KR) .................... 10-2022-0118836

(51) Int. Cl.
*H05K 5/03* (2006.01)
(52) U.S. Cl.
CPC ..................................... *H05K 5/03* (2013.01)
(58) Field of Classification Search
None
See application file for complete search history.

(56) References Cited

U.S. PATENT DOCUMENTS

| | | | |
|---|---|---|---|
| 6,583,935 B1 | 6/2003 | Saif et al. | |
| 6,660,388 B2 | 12/2003 | Liu et al. | |
| 7,486,019 B2 | 2/2009 | Padiyath et al. | |
| 8,025,958 B2 | 9/2011 | Yamamoto et al. | |
| 8,929,085 B2 | 1/2015 | Franklin et al. | |
| 9,069,521 B2 | 6/2015 | Lee et al. | |
| 9,429,999 B2 | 8/2016 | Lee et al. | |
| 9,688,051 B2 | 6/2017 | Min et al. | |
| 11,230,632 B2 | 1/2022 | Heo et al. | |
| 2014/0065326 A1* | 3/2014 | Lee | G09F 9/301 428/12 |
| 2015/0024170 A1 | 1/2015 | Min et al. | |
| 2017/0012225 A1* | 1/2017 | Heo | B05D 1/18 |

FOREIGN PATENT DOCUMENTS

| | | | | |
|---|---|---|---|---|
| CN | 109148486 A | | 1/2019 | |
| CN | 113097421 A | * | 7/2021 | ............. H10K 50/84 |
| CN | 114170913 A | | 3/2022 | |
| KR | 101329218 B1 | | 11/2013 | |
| KR | 102298373 B1 | | 9/2021 | |
| KR | 102311060 B1 | | 10/2021 | |
| WO | WO-2020118765 A1 | * | 6/2020 | ........... H10K 77/111 |

OTHER PUBLICATIONS

Peng—WO 2020-118765 A1—MT—flexible display panel w-MOF—2020 (Year: 2020).*
Seidi—MOF-Epoxy coatings—Materials—Jun. 2020 (Year: 2020).*
Chen—MOF coating—abrasion & self-cleaning—Chem. Eng.J.—2021 (Year: 2021).*
Qing—CN 113097421 A—MT—display w-MOF in layer—2021 (Year: 2021).*

* cited by examiner

*Primary Examiner* — John Vincent Lawler
(74) *Attorney, Agent, or Firm* — CANTOR COLBURN LLP

(57) ABSTRACT

A window includes a window base layer and a window protecting layer disposed on the window base layer. At least one of the window base layer or the window protecting layer includes a metal-organic framework. The window mitigates deformations and wrinkles caused by folding.

18 Claims, 14 Drawing Sheets

WINDOW AND DISPLAY DEVICE INCLUDING THE SAME

This application claims priority to Korean Patent Application No. 10-2022-0118836, filed on Sep. 20, 2022, and all the benefits accruing therefrom under 35 U.S.C. § 119, the content of which in its entirety is herein incorporated by reference.

BACKGROUND

1. Field

The disclosure herein relates to a window and a display device including the same, and more particularly, to a window capable of preventing deformation and wrinkles caused by folding, and a foldable flexible display device including the same.

2. Description of the Related Art

To provide image information to a user, display devices are used in various multimedia apparatuses, such as televisions, mobile phones, tablet computers, and game consoles. In recent days, various types of flexible display devices capable of folding or bending are being developed.

A flexible display device may include a foldable or bendable display panel and a window for protecting the display panel.

SUMMARY

In the flexible display device, the window may be deformed or wrinkled by repeating folding or bending operations. Therefore, it is desired to develop a window capable of mitigating deformation and wrinkles.

The disclosure provides a window capable of mitigating occurrence of deformation and winkles in a folding part.

The disclosure also provides a display device in which deformation and winkles in a folding part are mitigated.

An embodiment of the inventive concept provides a window including a window base layer and a window protecting layer disposed on the window base layer. At least one of the window base layer or the window protecting layer includes a metal-organic framework ("MOF").

In an embodiment, the window may be foldable with respect to a folding axis extending in one direction.

In an embodiment, the MOF may have a swelling characteristic at a temperature of about 60 degrees Celsius (° C.) to about 85° C. and at a humidity of about 85% to about 93%.

In an embodiment, the MOF may include at least one of an Fe-based MOF ("Fe-MOF"), a Ti-based MOF ("Ti-MOF"), or a Zr-based MOF ("Zr-MOF").

In an embodiment, the window base layer may have a thickness of about 30 micrometers ($\mu$m) to about 100 $\mu$m.

In an embodiment, the window protecting layer may have a thickness of about 30 $\mu$m to about 100 $\mu$m.

In an embodiment, the window may further include a window functional layer which includes at least one of a hard coating layer or an anti-fingerprint layer.

In an embodiment, the hard coating layer may be disposed on the window base layer.

In an embodiment, the anti-fingerprint layer may be disposed on the window protecting layer.

In an embodiment of the inventive concept, a window may include a window base layer and a window protecting layer disposed on the window base layer. At least one of the window base layer or the window protecting layer includes a MOF film.

In an embodiment, the MOF film may have a modulus of about 10 gigapascals (Gpa) or less.

In an embodiment, the MOF film may include a self-folding characteristic at a temperature of about 60° C. to about 85° C. and at a humidity of about 85% to about 93%.

In an embodiment, the MOF film may include at least one of an Fe-MOF, a Ti-MOF, or a Zr-MOF.

In an embodiment, the MOF film may have a thickness of about 30 $\mu$m to about 100 $\mu$m.

In an embodiment, the MOF film may be transparent.

In an embodiment of the inventive concept, a display device includes a window, a display panel, and a panel protecting layer disposed below the display panel. The window includes a window base layer and a window protecting layer disposed on the window base layer, and at least one of the window base layer, the window protecting layer, or the panel protecting layer includes an MOF.

In an embodiment, at least one of the window base layer or the window protecting layer may include an MOF.

In an embodiment, the window protecting layer may include at least one layer.

In an embodiment, the MOF may have a swelling characteristic at a temperature of about 60° C. to about 85° C. and at a humidity of about 85% to about 93%.

In an embodiment, the panel protecting layer may have a thickness of about 10 $\mu$m to about 50 $\mu$m.

In an embodiment, the display device may further include an adhesive layer disposed between the display panel and the panel protecting layer.

In an embodiment, the display device may further include a lower functional layer placed below the panel protecting layer. The lower functional layer includes at least one of a cushion layer including a resin, or a metal layer including a metal material.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1A:
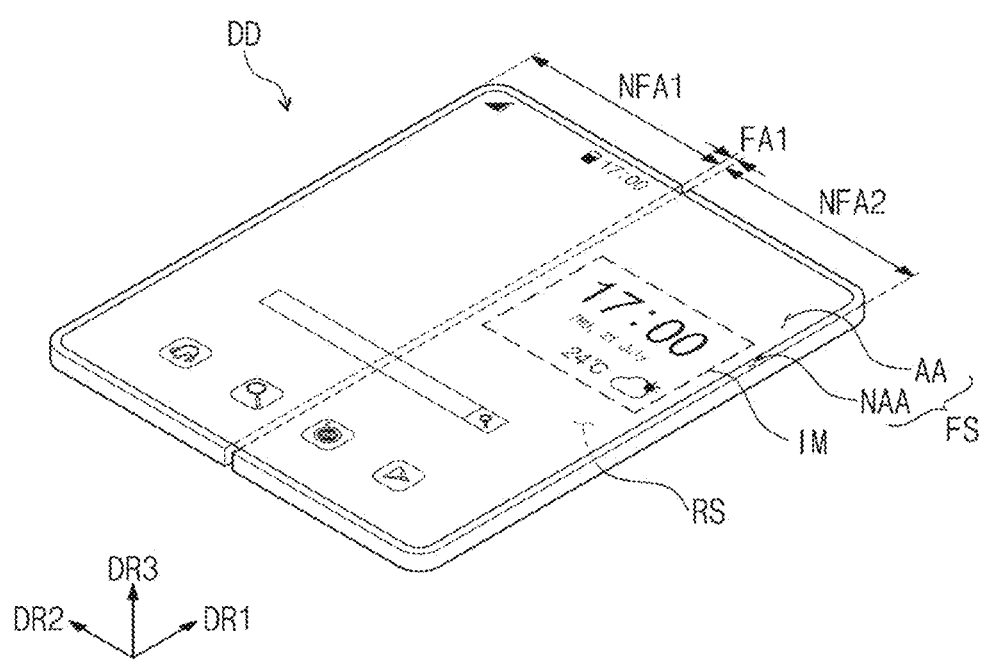
FIG. 1A is a combined perspective view illustrating an embodiment of an unfolded state of a display device according to the inventive concept.

In the inventive concept, various modifications may be made and various forms may be applied, and illustrative embodiments will be illustrated in the drawings and described in detail in the text. However, this is not intended to limit the inventive concept to a specific disclosure form, it should be understood to include all changes, equivalents, and substitutes included in the spirit and scope of the inventive concept.

It will be understood that when an element (region, layer, or part) is referred to as being "on", "connected to" or "coupled to" another component, it can be directly on, connected or coupled to the other element or intervening components may be present.

In contrast, herein, when an element is referred to as being "directly disposed on," other layers, membranes, regions, or plates, there are no intervening layers, membranes, regions, or plates present. For example, "directly disposed on" may mean that two layers or two members are directly disposed without using an additional intervening member, such as an adhesive member.

Like reference numerals or symbols refer to like elements throughout. The thickness and the ratio and the dimension of the element are exaggerated for effective description of the technical contents.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element from another element. For example, a first element discussed below could be termed a second element, and similarly, a second element discussed below could be termed a first element without departing from the teachings of an embodiment of the inventive concept. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the drawing figures.

The above terms are spatially relative concepts and are described according to the orientation depicted in the drawing figures. In the specification, the exemplary term "disposed on" can encompass both a case being disposed not only on a part of an upper part of any one member but also on a lower part of the member.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a window and a display device in an embodiment of the inventive concept will be described with reference to the accompanying drawings.

Figure 1B:
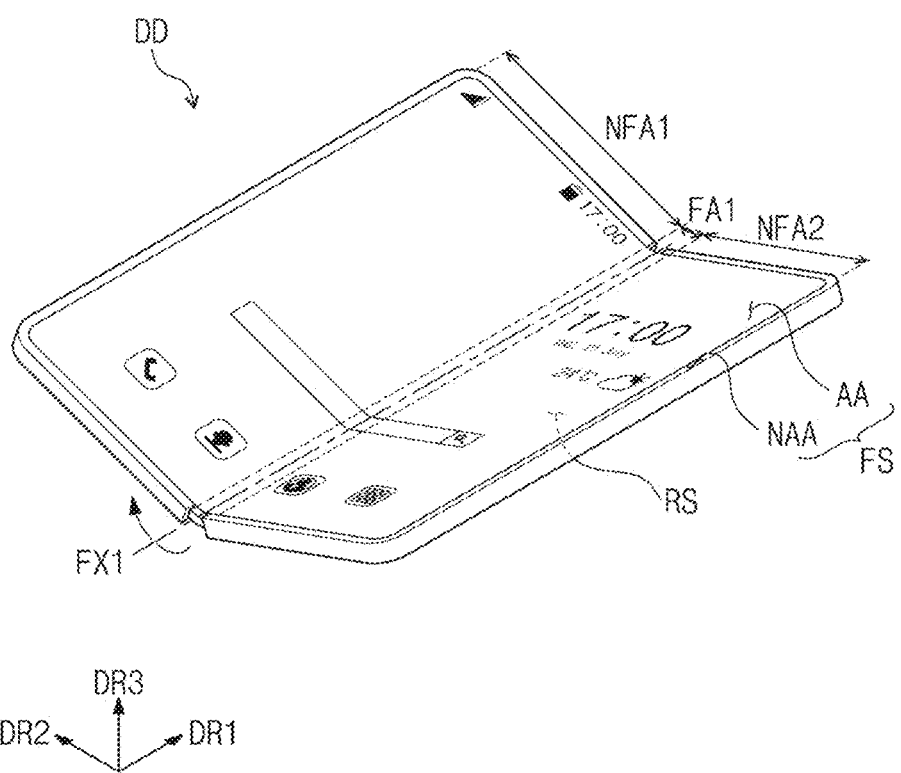
FIG. 1B is a combined perspective view illustrating an embodiment of an in-folded state of a display device according to the inventive concept.
Figure 1C:
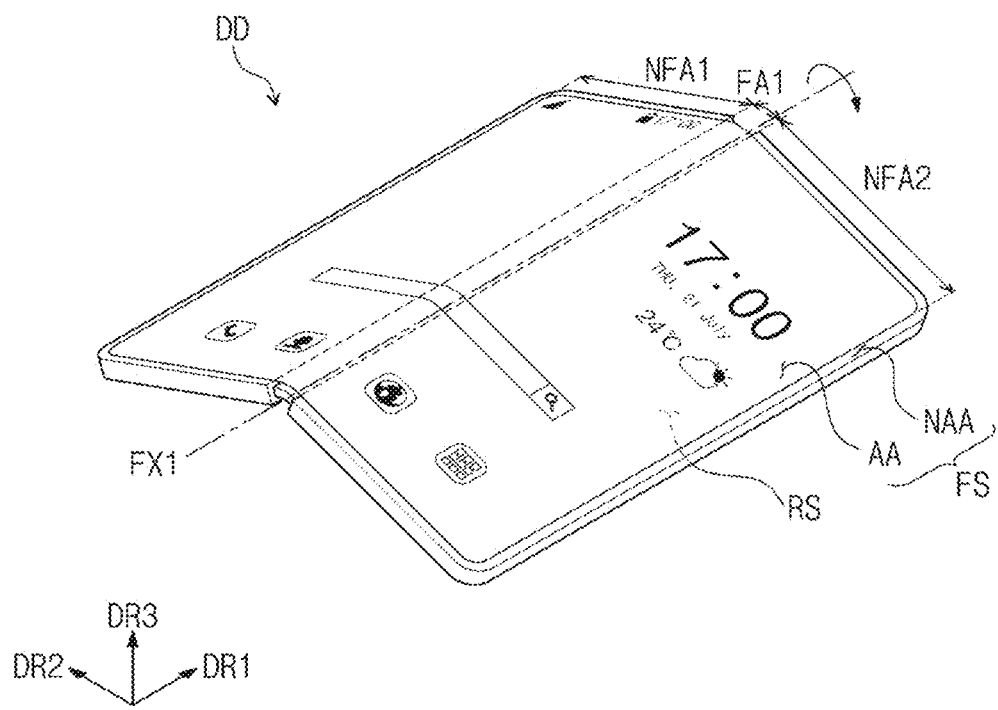
FIG. 1C is a combined perspective view illustrating an embodiment of an out-folded state of a display device according to the inventive concept.

FIG. 1A is a combined perspective view illustrating an embodiment of an unfolded state of a display device DD according to the inventive concept. FIG. 1B is a combined perspective view illustrating an embodiment of an in-folded state of the display device DD according to the inventive concept. FIG. 1C is a combined perspective view illustrating an embodiment of an out-folded state of the display device DD according to the inventive concept.

The display device DD in an embodiment may be activated in response to an electrical signal. In an embodiment, the display device DD may be a mobile phone, a tablet computer, a car navigation system, a game console, or a wearable device, for example, but the inventive concept is not limited thereto. In the specification, FIG. 1A, etc., illustrates that the display device DD is a mobile phone.

FIG. 1A and the following drawings illustrate a first direction DR1 through a third direction DR3, and directions indicated by the first through the third direction DR1, DR2, and DR3 described herein may be relative concepts and be thus changed into other directions. Also, the directions indicated by the first through the third directions DR1, DR2, and DR3 may be described as the first through the third directions, and the same reference numerals or symbols may be used.

Referring to FIGS. 1A through 1C, the display device DD in an embodiment may include a first display surface FS defined by the first direction DR1 and the second direction DR2 crossing the first direction DR1. The display device DD may provide an image IM to a user through the first display surface FS. The display device DD in an embodiment may display the image IM, in the third direction DR3, on the first surface FS parallel to each of the first direction DR1 and the second direction DR2. In this specification, a front surface (or an upper surface) and a rear surface (or a lower surface) of each member are defined with respect to the direction in which the image IM is displayed. The front and the rear surface may be opposed to each other in the third direction DR3, and a normal direction of each of the front surface and the rear surface may be parallel to the third direction DR3.

The display device DD in an embodiment may include the first display surface FS and a second display surface RS. The first display surface FS may include an active region AA and a peripheral region NAA. The active region AA may include an electronic module region (not shown). The second display surface RS may be defined as a surface which is opposed to at least a part of the first display surface FS. That is, the second display surface RS may be defined as a part of the rear surface of the display device DD.

The display device DD in an embodiment of the inventive concept may detect an external input applied from outside. The external input may include various types of inputs provided from the outside of the display device DD. In an embodiment, the external input may include an external input applied close to the display device DD, or an external input (e.g., hovering) adjacent to the display device DD within a predetermined distance, as well as a touch by a part of a user's body such as a user's hand, for example. In addition, the external input may have various forms such as force, pressure, temperature, light, or the like.

The display device DD may include a folding region FA1 and non-folding regions NFA1 and NFA2. The display device DD in an embodiment may include a first non-folding region NFA1 and a second non-folding region NFA2 disposed with the folding region FA1 therebetween. FIGS. 1A through 1C illustrate an embodiment of the display device DD including a single folding region FA1. However, the inventive concept is not limited thereto, and a plurality of folding regions may be defined in the display device DD.

Referring to FIG. 1B, the display device DD in an embodiment may be folded with respect to a first folding axis FX1. The first folding axis FX1 may be a virtual axis extending in the first direction DR1, and parallel to a long-side direction of the display device DD. The first folding axis FX1 may extend along the first direction DR1 on the first display surface FS.

In an embodiment, the first and second non-folding regions NFA1 and NFA2 may be disposed adjacent to the folding region FA1, with the folding region FA1 therebetween. In an embodiment, the first non-folding region NFA1 may disposed on one side of the folding region FA1 along the second direction DR2, and the second non-folding region NFA2 may be disposed on the other side of the folding region FA1 along the second direction DR2, for example.

The display device DD may be folded with respect to the first folding axis FX1, and transformed into the in-folded state in which one region overlapping the first non-folding region NFA1 of the first display surface FS and the other region overlapping the second non-folding region NFA2 of the first display surface FS are opposed to each other. When the display device DD in an embodiment is in the in-folded state, the second display surface RS may be viewed to a user. The second display surface RS may further include an electronic module region in which an electronic module including various components are disposed, but the inventive concept is not limited thereto.

Referring to FIG. 1C, the display device in an embodiment of the inventive concept may be folded with respect to the first folding axis FX1, and transformed into the out-folded state in which one region overlapping the first non-folding region NFA1 of the second display surface RS and the other region overlapping the second non-folding region NFA2 of the second display surface RS are opposed to each other. However, the inventive concept is not limited thereto, the display DD may be folded with respect to a plurality of the folding axes, and a part of the first display surface FS and a part of the second display surface RS may be opposed to each other. The number of the folding axes and the number of the non-folding regions corresponding thereto are not particularly limited.

The display device DD may further include various electronic modules. In an embodiment, the electronic modules may include at least one of a camera, a speaker, an optical sensor, or a thermal sensor, for example. The electronic module may detect an external object received through the first or second display surface FS or RS, and provide a sound signal such as a voice to the outside through the first or second display surface FS or RS. The electronic modules may each include a plurality of components, but the inventive concept is not limited thereto.

Figure 2A:
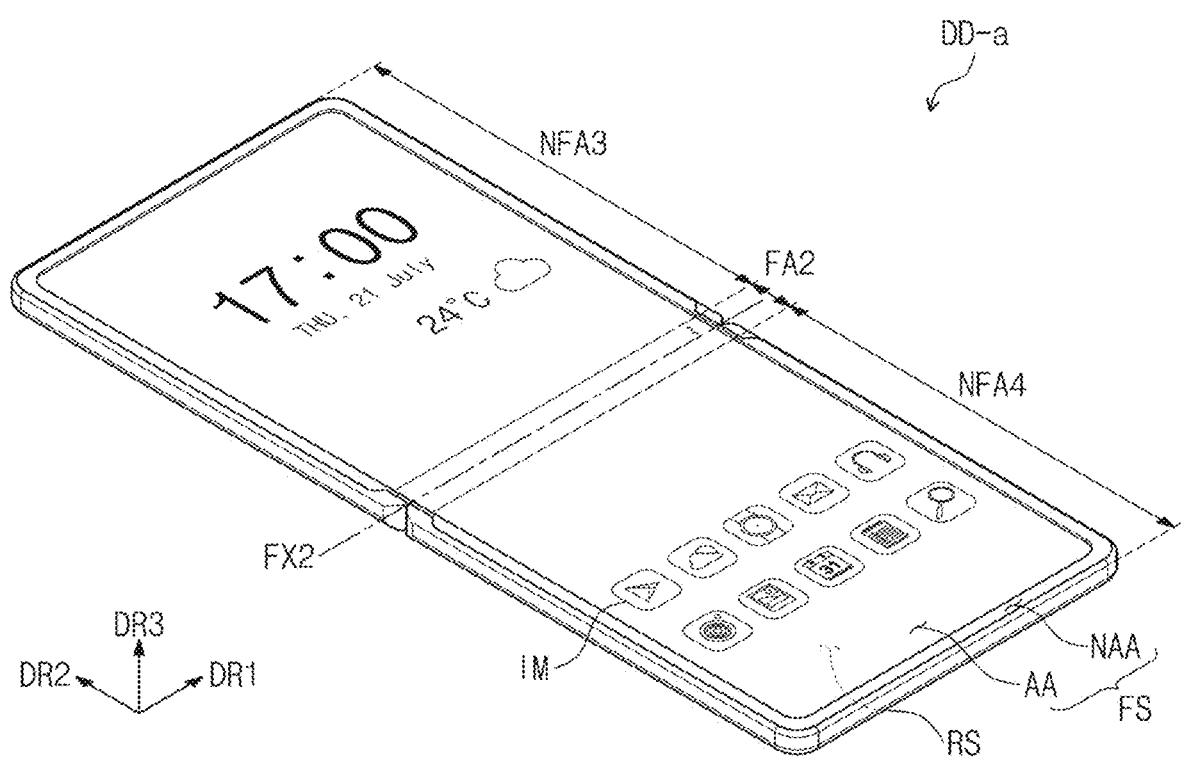
FIG. 2A is a combined perspective view illustrating an embodiment of an unfolded state of a display device according to the inventive concept.
Figure 2B:
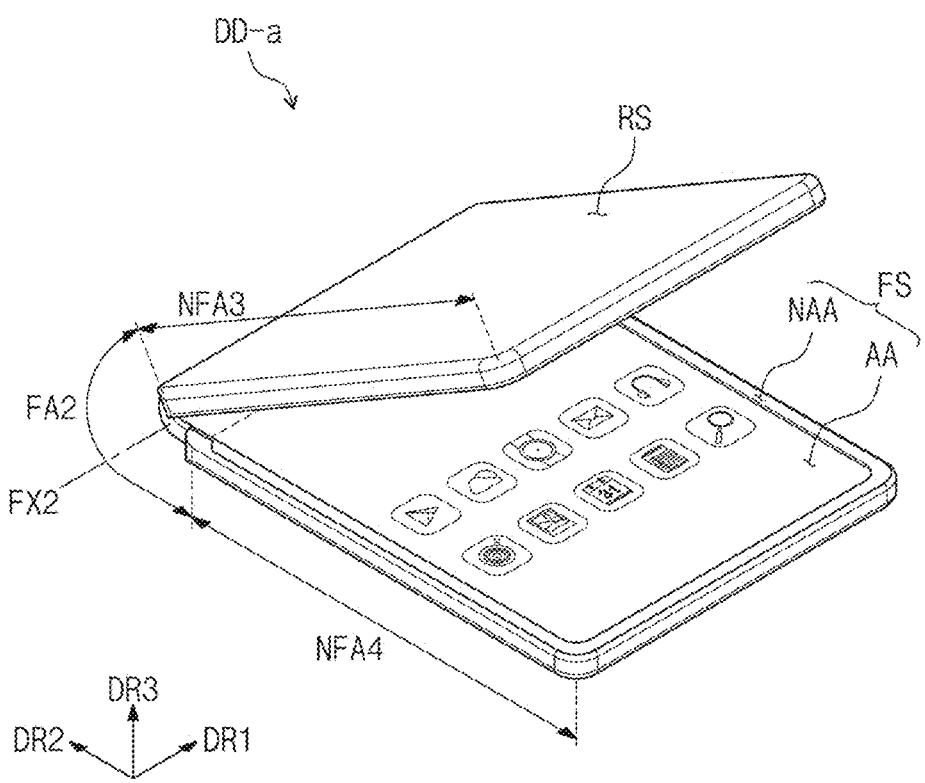
FIG. 2B is a combined perspective view illustrating an embodiment of an in-folded state of a display device according to the inventive concept.

FIG. 2A is a combined perspective view illustrating an embodiment of an unfolded state of a display device DD-a according to the inventive concept. FIG. 2B is a combined perspective view illustrating an embodiment of the in-folded state of the display device DD-a according to the inventive concept.

The display device DD-a of an embodiment may be folded with respect to the second folding axis FX2 extending in one direction parallel to the first direction DR1. FIG. 2B illustrates that an extension direction of the second folding axis FX2 is parallel to an extension direction of a short side of the display device DD-a. However, the inventive concept is not limited thereto.

The display device DD-a in an embodiment may include at least one folding region FA2 or non-folding regions NF3 and NFA4 adjacent to the folding region FA2. The non-folding regions NF3 and NF4 may be spaced apart from each other with the folding region FA2 therebetween.

In an embodiment, the display device DD-a may be in-folded such that a third non-folding region NFA3 and a fourth non-folding region NF4 face each other, and the first display surface FS is not exposed to the outside. In addition, unlike what is illustrated, the display device DD-a in an embodiment of the inventive concept may be out-folded such that the first display surface FS is exposed to the outside. Also, the display device DD-a in an embodiment of the inventive concept may include a first display surface FS and a second display surface RS, and the first display surface FS may include an active region AA and a peripheral region NAA. Also, the display device DD-a may further include various electronic modules.

The display devices DD and DD-a in an embodiment of the inventive concept described with reference to FIGS. 1A through 1C, 2A and 2B may be configured such that an in-folding or an out-folding operation is repeated from an unfolding operation and vice versa, but the inventive concept is not limited thereto. In an embodiment of the inventive concept, the display devices DD and DD-a may select any one of the unfolding operation, the in-folding operation, or the out-folding operation. Also, although not illustrated, the display device in an embodiment of the inventive concept may be a flexible display device including a plurality of folding regions, or at least one region capable of bending or rolling.

Figure 3:
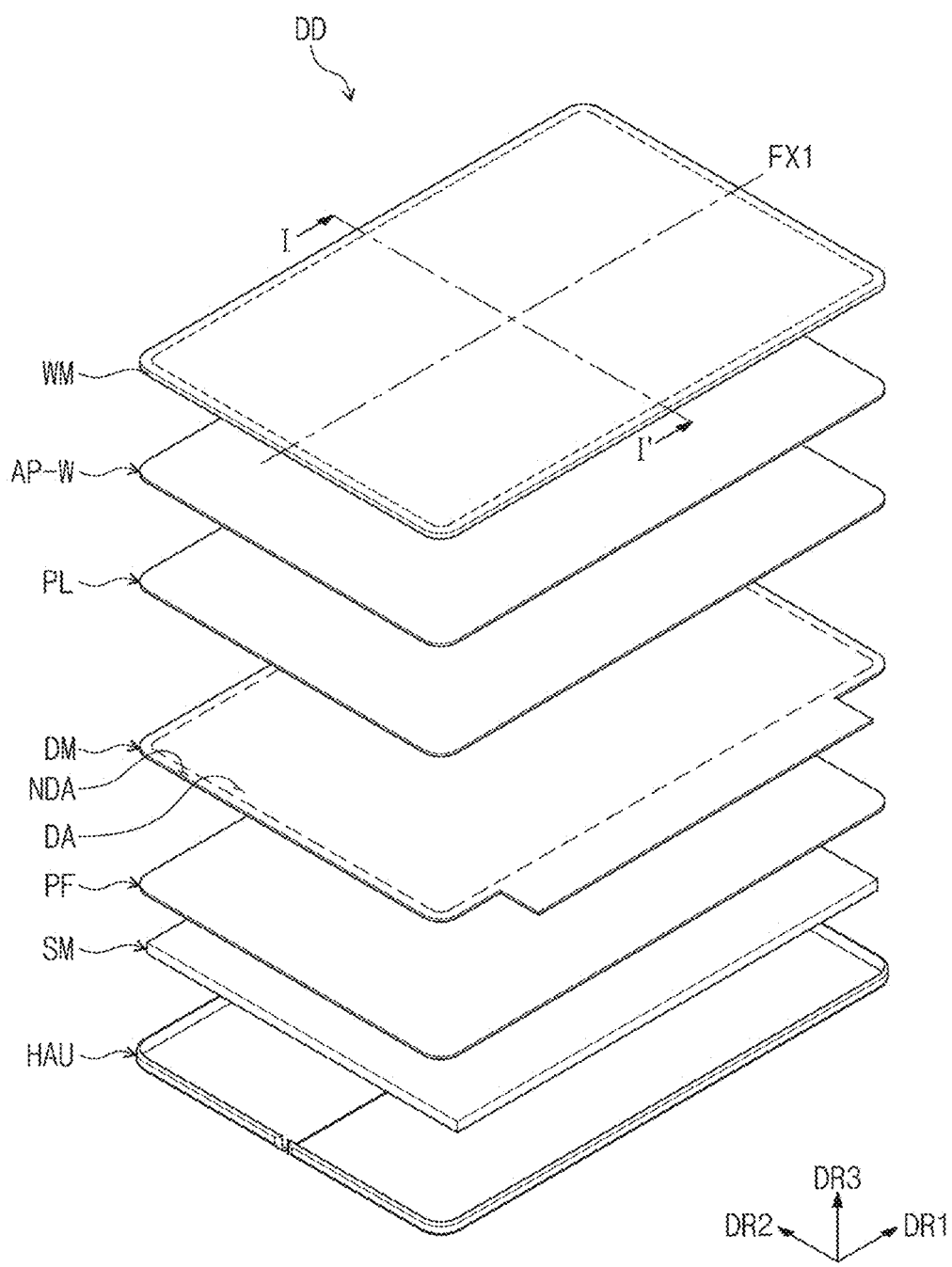
FIG. 3 is an exploded perspective view of an embodiment of a display device according to the inventive concept.
Figure 4:
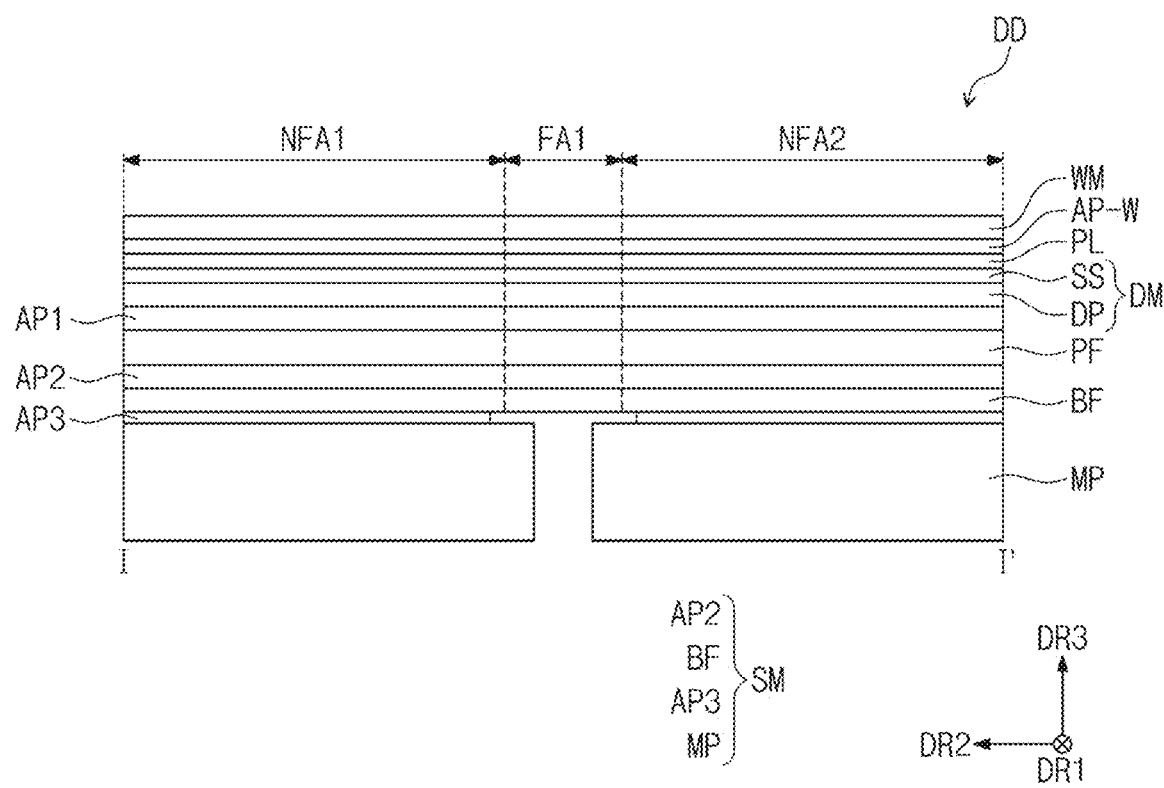
FIG. 4 is a cross-sectional view of an embodiment of a display device according to the inventive concept.

FIG. 3 is an exploded perspective view of an embodiment of a display device DD according to the inventive concept. FIG. 4 is a cross-sectional view of an embodiment of a display device DD according to the inventive concept. FIG. 3 illustrates an exploded perspective view of an embodiment of the display device DD illustrated in FIG. 1A. FIG. 4 may be a cross-sectional view taken along line I-I' of FIG. 3.

Referring to FIGS. 3 and 4, the display device DD in an embodiment may include a display module DM and a window WM disposed on the display module DM. Also, the display device DD in an embodiment of the inventive concept may further include an electronic module (not shown) disposed below the display module DM. In an embodiment, the electronic module (not shown) may include a camera module, for example.

The display device DD in an embodiment of the inventive concept may further include an adhesive layer AP-W and a polarizing film PL which are disposed between the display module DM and the window WM. In addition, the display device DD in an embodiment may further include a panel protecting layer PF and a lower functional layer SM, which are disposed below the display module DM. The display device DD may further include a housing HAU accommodating the display module DM, the lower functional layer SM or the like. The housing HAU may be coupled to the widow WM. Although not illustrated, the housing HAU may further include a hinge structure for easy folding or bending.

The folding region FA1 and the first and second non-folding regions NFA1 and NFA2 in FIG. 4 may correspond to the folding region FA1 and the first and second non-folding regions NFA1 and NFA2 in FIG. 1A, respectively.

The window WM may cover the entirety of the upper surface of the display module DM. The window WM may have a shape corresponding to the shape of the display module DM. The window WM may have flexibility to be deformed according to deformation by folding or bending of the display device DD. In addition, the window WM may function to protect the display module DM from external impact. The window WM in an embodiment of the inventive concept will be described in more detail later.

In the display device DD of an embodiment, the adhesive layer AP-W disposed between the window WM and the display module DM may be an optically clear adhesive film ("OCA") or an optically clear adhesive resin layer ("OCR"). The adhesive layer AP-W may be omitted in an embodiment of the inventive concept.

In the display device DD in an embodiment, the polarizing film PL disposed between the window WM and the display module DM may be a film including an optical function for improving the light-extraction efficiency of the display module DM.

The display module DM may display an image in response to an electrical signal and transmit/receive information about an external input. The display module DM may include a display region DA and a non-display region NDA. The display region DA may be defined as a region in which the image provided by the display module DM is emitted. Referring to FIG. 4, the display module DM may include a display panel DP and a sensor layer SS disposed on the display panel DP. The display module DM will be described in more detail later.

The panel protecting layer PF disposed below the display module DM may be a layer that protects the rear surface of the display module DM. The panel protecting layer PF may overlap an entirety of the display module DM. The panel protecting layer PF may include a polymer material. In an embodiment, the panel protecting layer PF may be a polyimide ("PI") film or a polyethylene terephthalate ("PET") film.

In an embodiment of the inventive concept, the panel protecting layer PF may include a MOF which will be described later. This makes it possible to reduce a stress applied to a folding part during folding, and also to mitigate deformation and wrinkles of the folding part caused by the stress.

The panel protecting layer PF may have a thickness of about 10 micrometers (µm) to about 50 µm in the third direction DR3. When the panel protecting layer PF has a thickness in the above-mentioned range, the panel protecting layer PF may not only have durability but also maintain flexibility which enables folding or the like. An adhesive layer may be further included between the display module DM and the panel protecting layer PF.

The lower functional layer SM disposed below the display module DM may support the display module DM or prevent the display module DM from being deformed by external impact or force. The lower functional layer SM may include at least one of a cushion layer BF, a support plate, a shielding layer, a filling layer, or an inter-bonding layer.

The cushion layer BF may be a functional layer used to protect the display module DM from impact applied therebelow. The cushion layer BF may include, e.g., a sponge, a foam, or an elastomer such as a urethane resin. To enhance a function, a barrier film including a polyimide ("PI"), or a polyethylene terephthalate ("PET") may be used together.

The support plate may be formed from a metal material or a polymer material. The support plate may be, e.g., a metal layer MP as in FIG. 4. The metal layer MP may be a plate including materials which are strong against deformation, and have an elastic modulus of about 60 gigapascals (GPa) or more. The metal layer MP may be used to support an upper module, prevent foreign matter from occurring in a lower module, and improve heat dissipation performance. A folding part of the metal layer MP corresponding to the folding region FA1 may adopt a predetermined pattern shape so as to be deformable. In an embodiment, FIG. 4 illustrates a shape in which the folding part of the metal layer MP is split, for example, but the inventive concept is not limited thereto. In an embodiment, a lattice shape or the like may be applied.

The shielding layer may be an electromagnetic wave shielding layer or a heat dissipation layer. Also, the shielding layer may function as a bonding layer. The inter-bonding layer may be provided in the form of a bonding resin layer or an adhesive tape. The filling layer may fill a space between the panel protecting layer PF and the housing HAU, and fix the panel protecting layer PF.

Also, the display device DD in an embodiment may further include at least one adhesive layer. At least one adhesive layer may be an optically clear adhesive film ("OCA") or an optically clear adhesive resin layer ("OCR"). Referring to FIG. 4, a first adhesive layer AP1 may be disposed between the display module DM and the panel protecting layer PF, a second adhesive layer AP2 may be disposed between the panel protecting layer PF and the cushion layer BF, and a third adhesive layer AP3 may be disposed between the cushion layer BF and the metal layer MP.

FIG. 4 illustrates that the lower functional layer SM includes the second adhesive layer AP2, the third adhesive layer AP3, the cushion layer BF and the metal layer MP, but the inventive concept is not limited thereto.

Also, although not illustrated, the display device in an embodiment may further include an adhesive layer between the polarizing film PL and the display panel DP.

Figure 5A:
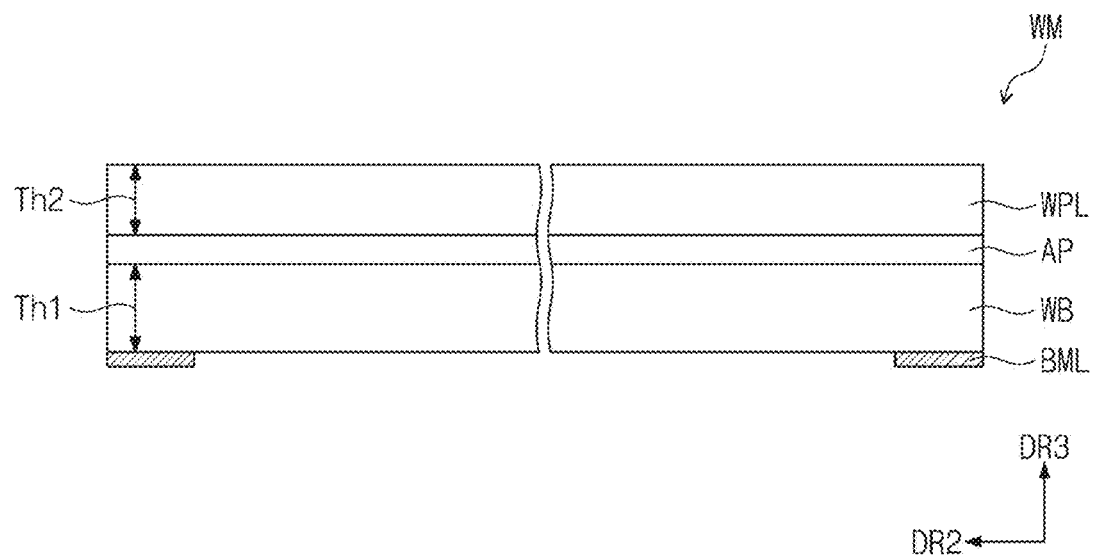
FIGS. 5A through 5C are cross-sectional views of an embodiment of a window according to the inventive concept.
Figure 5B:
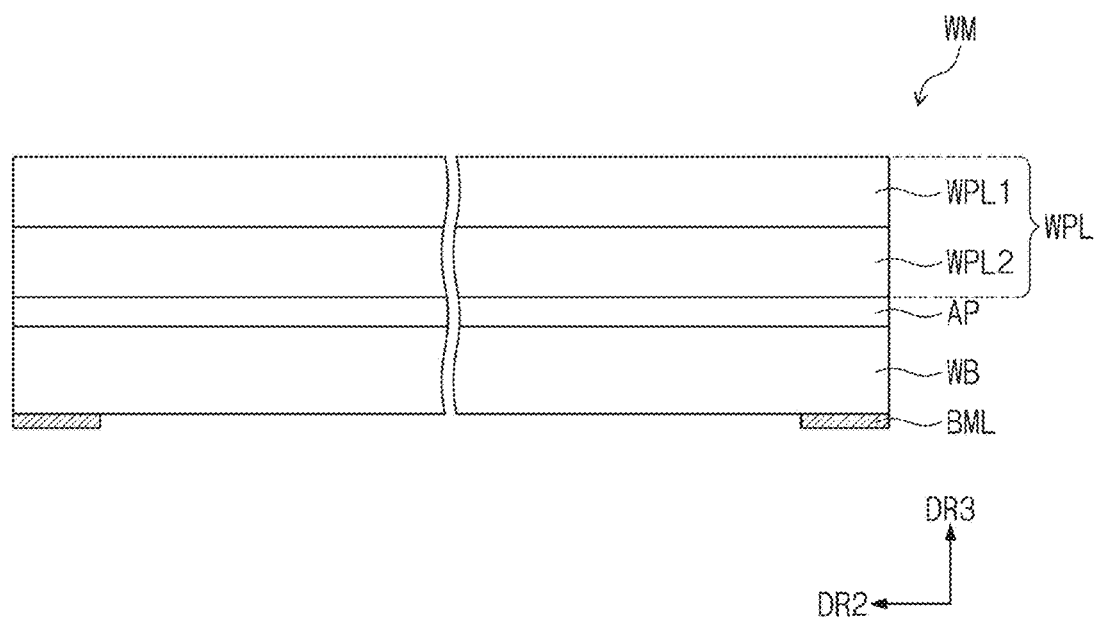
Figure 5C:
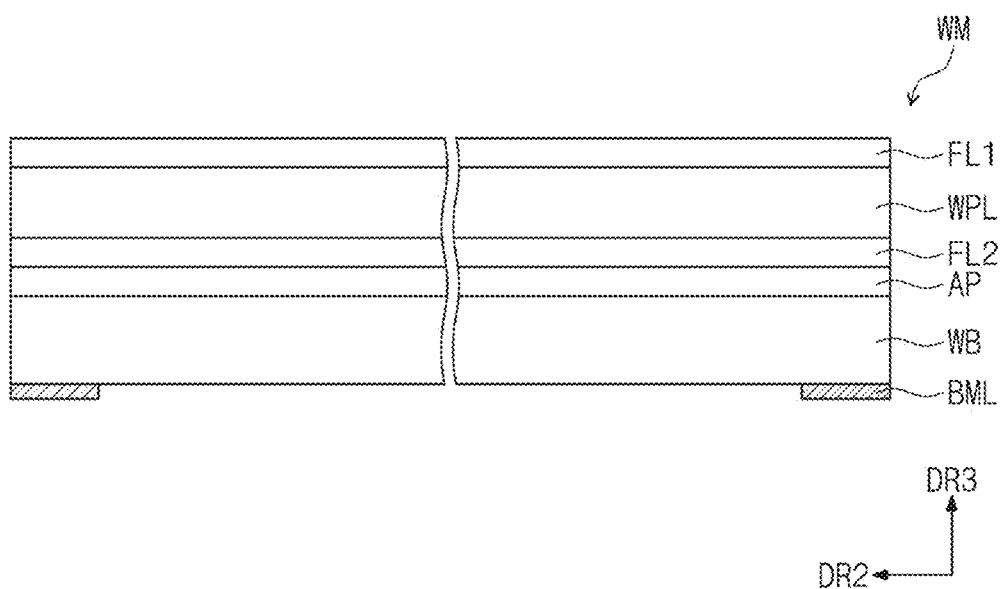
Figure 7:
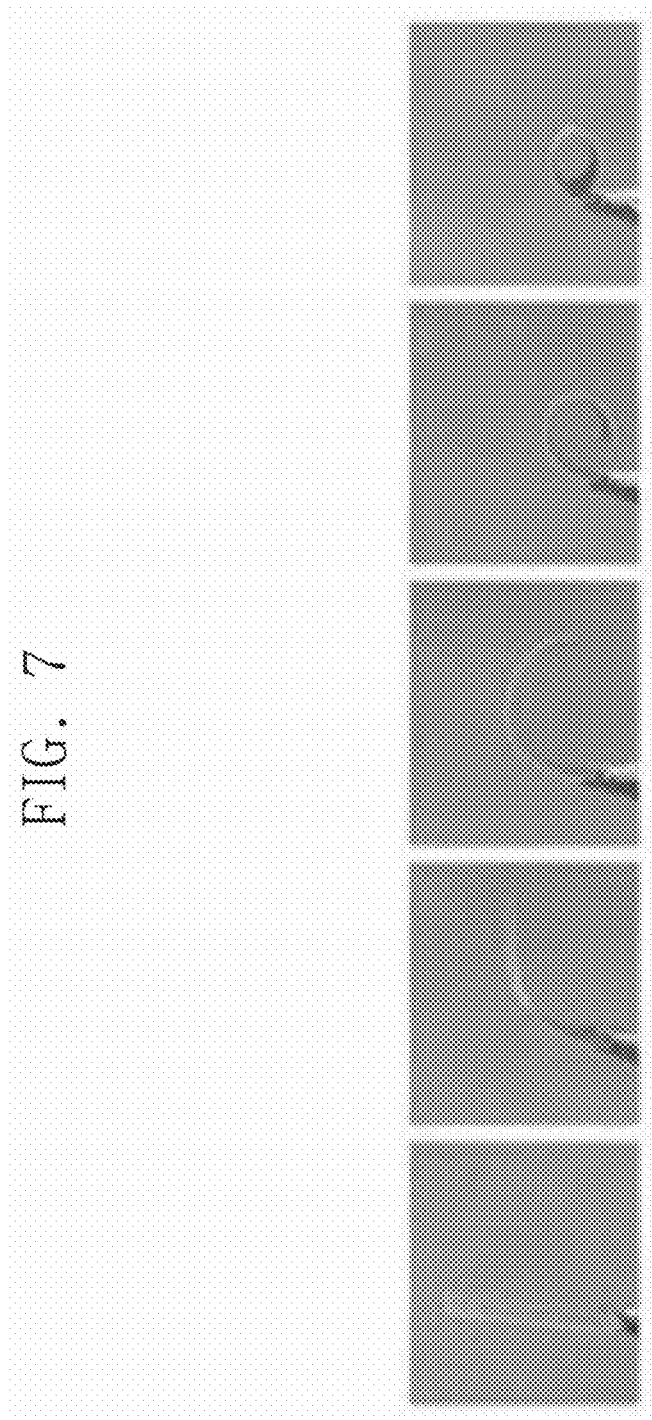
FIG. 7 is an image of an embodiment of a metal-organic framework ("MOF") film according to the inventive concept.
Figure 8A:
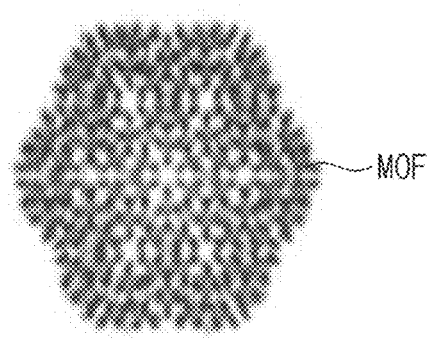
FIGS. 8A and 8B are images schematically showing an embodiment of the MOF according to the inventive concept.
Figure 8B:
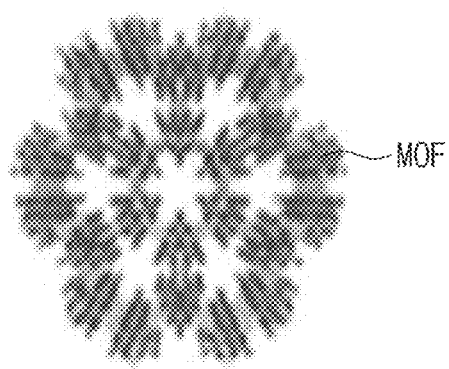
Figure 9A:
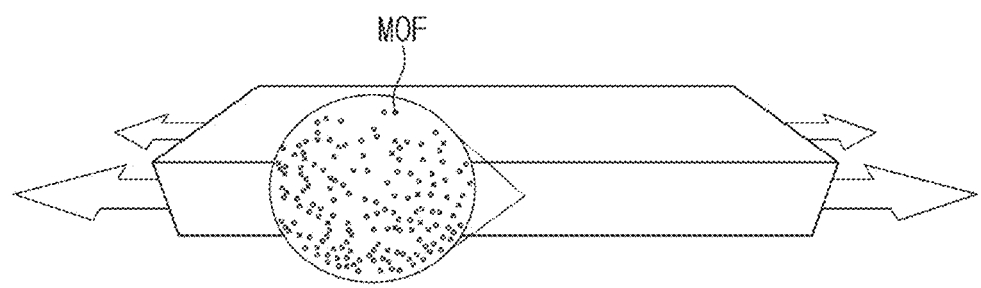
FIGS. 9A and 9B are images schematically showing an embodiment of a MOF film according to the inventive concept.
Figure 9B:
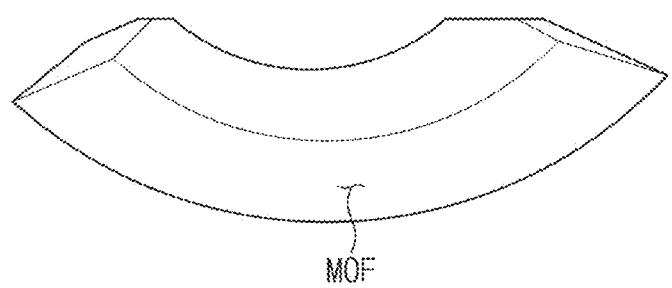

FIGS. 5A through 5C are cross-sectional views of an embodiment of the window WM according to the inventive concept. FIG. 7 is an image of an embodiment of the MOF film according to the inventive concept. FIGS. 8A and 8B are images schematically showing an embodiment of the MOF according to the inventive concept. FIGS. 9A and 9B are images schematically illustrating an embodiment of a MOF film according to the inventive concept.

The window WM in an embodiment includes a window base layer WB and a window protecting layer WPL disposed on the window base layer WB. The window WM may be included in the display devices DD and DD-a described above with reference to FIGS. 1A through 4.

The window WM in an embodiment may have flexibility and be thus capable of folding and bending, and protect the display module DM (FIG. 4) disposed therebelow from the outside. The window WM may be foldable with respect to an axis extending in one direction.

The window base layer WB may have a thickness Th1 of about 30 μm to about 100 μm in the third direction DR3. When the window base layer WB has a thickness Th1 in the above-mentioned range, the window base layer WB may not only have durability but also maintain flexibility which enables folding or the like.

The window WM may include a printed layer BML. The printed layer BML may be disposed on one surface of the window base layer WB. The printed layer BML may be disposed on an edge region of the window base layer WB. The printed layer BML may be an ink-printed layer. Also, the printed layer BML may be formed including a pigment or a dye. On the window base layer WB, the printed layer BML may be a part corresponding to the non-display region NDA (FIG. 3) of the display module DM.

The window protecting layer WPL may be disposed above the window base layer WB and become uppermost layers of the display devices DD and DD-a (FIGS. 1A and 2A). The window protecting layer WPL may be a layer exposed to the outermost surfaces of the display devices DD and DD-a (FIGS. 1A and 2A), and function to protect the window base layer WB and the display device DM.

The window protecting layer WPL may have a thickness Th2 of about 30 μm to about 100 μm in the third direction DR3. When the window protecting layer WPL has a thickness Th2 in the above-mentioned range, the window protecting layer WPL may have not only durability, but also maintain flexibility which enables folding or the like.

The window protecting layer WPL may have a single-layer structure or a multilayer structure. In an embodiment, the window protecting layer WPL may be a single layer structure as illustrated in FIG. 5A, or be, as illustrated in FIG. 5B, be a two-layer structure including a first window protecting layer WPL1 and a second window protecting layer WPL2, for example.

The window adhesive layer AP may bond the window base layer WM and the window protecting layer WPL to each other. The window adhesive layer AP may be an optically clear adhesive film ("OCA") or an optically clear adhesive resin layer ("OCR").

The window WM including the window base layer WB, the window adhesive layer AP, and the window protecting layer WPL may show optical characteristics of a transmittance of about 90% and more and a haze of about 1% or less in the visible light range.

The window WM may further include the first and second window functional layers FL1 and FL2 including at least one of a hard coating layer or an anti-fingerprint layer. Each of the first and second window functional layers FL1 and FL2 may be the hard coating layer, the anti-fingerprint layer, or may be a layer that functions as a hard coating layer and an anti-fingerprint layer at the same time. The hard coating layer may be a layer which imparts a physical strength on the window. The anti-fingerprint layer may be a layer which prevents external contamination such as fingerprints, and suppresses wear caused by external friction. In addition, each of the first and second window functional layers FL1 and FL2 may further include an anti-reflection or anti-glare function.

The hard coating layer may be disposed on the window base layer WB. The anti-fingerprint layer may be disposed on the window protecting layer WPL. In an embodiment, the window WM, as illustrated in FIG. 5C, may include a first window functional layer FL1 disposed on the window protecting layer WPL, and a second window functional layer FL2 disposed between the window adhesive layer AP and the window protecting layer WPL, for example. However, the positions of the first and second window functional layers FL1 and FL2 in the window WM are not limited to the positions illustrated in FIG. 5C. In addition, in the window WM, each of the first window functional layer FL1 and the second window functional layer FL2 may be omitted.

The folding part of the window WM may be deformed due to a stress applied to the folding part during folding, and winkles may occur, for example. When the deformation of the folding part is severe, even a crack may occur in the window WM. The deformation and wrinkles may easily occur in a high-temperature and high-humidity environment. The window WM in an embodiment of the inventive concept includes a MOF which will be described later, thus preventing aforementioned damages from occurring in the folding part in the high-temperature and high-humidity environment.

At least one of the window base layer WB or the window protecting layer WPL may include an MOF.

The MOF is a porous material in which a centered-cluster including metal ions or metals are coordinated to organic ligands to form a 3-dimensional structure. That is, the MOF is a kind of coordination polymers. The MOF may include, e.g., at least one of an Fe-based MOF ("Fe-MOF"), a Ti-based MOF ("Ti-MOF"), or a Zr-based MOF ("Zr-MOF"). However, a material of the MOF is not limited thereto.

The MOF has a substantially large predetermined surface area and excellent porosity. The MOF may have a characteristic of swelling under a high-temperature and high-humidity condition, that is, a swelling characteristic. In an embodiment, the MOF may have a swelling characteristic at a temperature of about 60 degrees Celsius (° C.) to about 85° C. and at a humidity of about 85% to about 93%, for example. The temperature of about 60° C. to about 85° C. and the humidity of about 85% to 93% may provide a high-temperature and high-humidity condition under which the display device is exposed in an actual environment.

FIG. 8A is a schematic diagram illustrating a state in which the MOF is in a deswelling state under a low-temperature and low-humidity condition, and FIG. 8B is a schematic diagram illustrating a state in which the MOF is swelled under a high-temperature and high-humidity condition. That is, under a high-temperature and high-humidity condition, the MOF may absorb moisture and swell. The MOF may have the state illustrated in FIG. 8A or the state illustrated in FIG. 8B reversibly according to ambient temperature and humidity.

The window base layer WB or the window protecting layer WPL including a MOF makes it possible to reduce a stress applied to a folding part during folding, and also to mitigate deformation and wrinkles of the folding part caused by the stress.

At least one of the window base layer WB or the window protecting layer WPL may include the MOF film. The MOF may have the above-mentioned swelling characteristic. Accordingly, the MOF film may have a self-folding characteristic. In an embodiment, the MOF film may have a self-folding characteristic at a temperature of about 60° C. to about 85° C. and at a humidity of about 85% to about 93%, for example.

FIG. 7 represents observation images showing that a MOF film having a thickness Th3 (refer to FIG. 10) of 50 μm in the third direction DR3 (refer to FIG. 4, for example) is a gradually folded under a high-temperature and high-humidity condition (60° C., 93%). In addition, FIG. 9A is a schematic diagram illustrating a state in which the MOF film is flat under a low-temperature and low-humidity condition, and FIG. 9B is a schematic diagram illustrating a state in which the MOF film is folded under a high-temperature and high-humidity condition.

Referring FIGS. 8A, 8B, 9A, and 9B, the MOF film may have a flat unfolded state under a low-temperature and low-humidity condition, and may have a self-folding characteristic as the MOF swells under a high-temperature and high-humidity condition. Accordingly, the MOF film may reduce the stress applied to the folding part during folding.

Accordingly, the window base layer WB or the window protective layer WPL including the MOF film makes it possible to mitigate deformation and wrinkles of the folding part caused by the stress.

The MOF film may have a modulus of about 10 Gpa or less. As the MOF film has the modulus in the above-mentioned range, the MOF film may be suitable for application to the foldable window WM.

Also, the MOF film may have a thickness of about 30 μm to about 100 μm in the third direction DR3. When the MOF film has a thickness in the above-mentioned range, the window WM may not only have durability but also maintain flexibility which enables folding or the like.

In addition, the MOF film may be transparent. In an embodiment, in the visible light range, the MOF film may show an optical characteristic of a transmittance of about 90% and more, and a haze of about 1% or less, for example.

Figure 6:
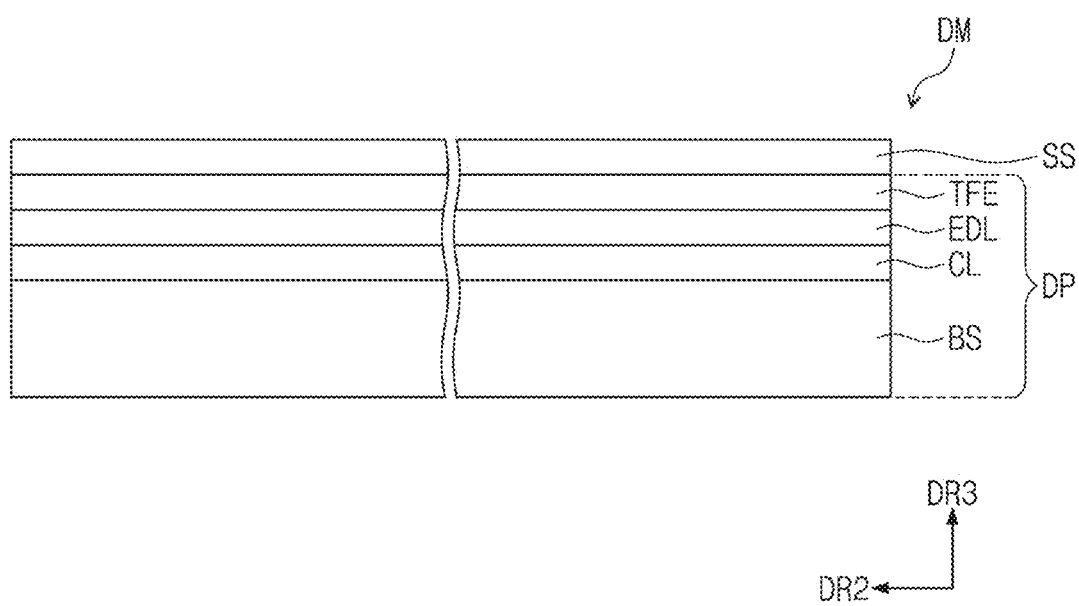
FIG. 6 is a cross-sectional view of an embodiment of a display module according to the inventive concept.

FIG. 6 is a cross-sectional view of an embodiment of a display module DM according to the inventive concept. The display module DM may include a display panel DP and a sensor layer SS disposed on the display panel DP.

The display panel DP may include a base layer BS, a circuit layer CL, a light-emitting element layer EDL, and an encapsulation layer TFE.

The base layer BS may be a member that provides a base surface on which the circuit layer CL is disposed. The base layer BS may be a rigid substrate or a flexible substrate capable of bending, folding, rolling or the like. The base layer BS may be a glass substrate, a metal substrate, or a polymer substrate. However, the inventive concept is not limited thereto, and the base layer BS may be an inorganic layer, an organic layer, or a composite material layer.

The circuit layer CL may be disposed on the base layer BS. The circuit layer CL may include an insulating layer, a semiconductor pattern, a conductive pattern, and a signal line. The insulating layer, the semiconductor layer, and the conductive layer may be formed on the base layer BS through coating, depositing, etc., and the insulating layer, the semiconductor layer, and the conductive layer may be selectively patterned by performing a photolithography process and an etching process multiple times. Thereafter, a semiconductor pattern, a conductive pattern, and a signal line, which are included in the circuit layer CL, may be formed.

The light-emitting element layer EDL may be disposed on the circuit layer CL. The light-emitting element layer EDL may include a light-emitting element. In an embodiment, the light-emitting element may include an organic light-emitting material, an inorganic light-emitting material, an organic-inorganic light-emitting material, a quantum dot, a quantum rod, a micro light emitting diode ("LED"), or a nano LED, for example.

The encapsulation layer TFE may be disposed on the light-emitting element layer EDL. The encapsulating layer TFE may cover the light-emitting element layer EDL. The encapsulation layer TFE may protect the light-emitting element layer EDL from foreign matter such as moisture, oxygen, and dust particles.

The sensor layer SS may be disposed on the display panel DP. The sensor layer SS may detect an external input applied from the outside. The external input may be a user's input. The user's input may include various types of external inputs such as a touch by the user's body part, light, heat, pen, pressure, or the like.

The sensor layer SS may be formed on the display panel DP through a continuous process. In this case, the sensor layer SS may be directly disposed on the display panel DP. Herein, "directly disposed" may mean that the third component is not disposed between the sensor layer SS and the display panel DP. That is, an additional adhesive member may be not disposed between the sensor layer SS and the display panel DP. In an embodiment, the sensor layer SS may be directly disposed on the encapsulation layer TFE in the display panel DP, for example. The sensor layer SS and the display panel DP may be bonded to each other using the adhesive member. The adhesive member may include a typical adhesive agent or bonding agent.

An optical layer (not illustrated) may further be disposed on the sensor layer SS. The optical layer may be directly disposed on the sensor layer SS. The optical layer may be formed on the sensor layer SS by performing a continuous process. The optical layer may reduce the reflectance for external light incident from the outside of the display module DM. The optical layer may include a polarization layer or a color filter layer.

In an embodiment, the sensor layer SS may be omitted, and the optical layer may be directly disposed on the display panel DP. In an embodiment, positions of the sensor layer SS and the optical layer may be interchanged.

Figure 10:
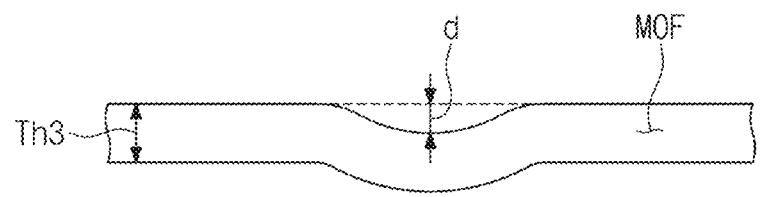
FIG. 10 is a diagram illustrating an embodiment of a wrinkle depth of a MOF film according to the inventive concept.

FIG. 10 is a view illustrating, in an embodiment of the inventive concept, a wrinkle depth (d) of a MOF film. The deformation and wrinkles of the MOF film in an embodiment of the inventive concept were tested.

In Example 1, a 50 nm-thick Fe (III) dicarboxylate MIL-88+polyvinylidene difluoride ("PVDF") matrix film was left for 24 hours in a folded state under a high-temperature and high-humidity condition (60° C., 93%), and the depth of wrinkles, when unfolded, was measured. Three tests were performed, and an average depth is shown in Table 1.

For Comparative Examples 1 and 2, the average depths of wrinkles were measured under the same conditions as in Example 1, except that the type of film in Example 1 was changed to a polyimide ("PI") film and a polyethylene terephthalate ("PET") film, respectively.

TABLE 1

| | Film type | Depth of wrinkles (d, μm) |
|---|---|---|
| Example 1 | MOF | 10 |
| Comparative Example 1 | PI | 28 |
| Comparative Example 2 | PET | 38 |

Referring to Table 1, it may be confirmed that a film of Example 1 has a smaller average depth of wrinkles than those of the films of Comparative Examples 1 and 2. That is, under the same folding conditions, it may be confirmed that the film of Example 1 mitigated occurrence of deformation and wrinkles. It is considered that this is because under a high-temperature and high-humidity condition, the MOF has a swelling characteristic, and accordingly, the MOF film has a self-folding characteristic, thus mitigating deformation and wrinkles. That is, it is considered that due to the self-folding characteristic of the MOF film, the stress applied during folding is reduced, thereby mitigating deformation and wrinkles.

A window WM in an embodiment of the inventive concept may include a MOF and thus the window WM capable of mitigating deformation and winkles during folding may be provided.

A display device DD in an embodiment of the inventive concept may include a MOF and thus a display device DD in which deformation and winkles during folding are mitigated may be provided.

A window in an embodiment may include the MOF and thus the window capable of mitigating deformation and winkles during folding may be provided.

A display device in an embodiment may include the MOF and thus a display device in which deformation and winkles during folding are mitigated may be provided.

Although the embodiments of the inventive concept have been described, it is understood that the inventive concept should not be limited to these embodiments but various changes and modifications may be made by one ordinary skilled in the art within the spirit and scope of the inventive concept as hereinafter claimed.

What is claimed is:

1. A window comprising:
a window base layer; and
a window protecting layer disposed on the window base layer,
wherein at least one of the window base layer or the window protecting layer includes a metal-organic framework,
wherein the window base layer has a thickness of about 30 micrometers to about 100 micrometers and the window protecting layer has a thickness of about 30 micrometers to about 100 micrometer.

2. The window of claim 1, wherein the window is foldable with respect to a folding axis extending in one direction.

3. The window of claim 1, wherein the metal-organic framework has a swelling characteristic at a temperature of about 60 degrees Celsius to about 85 degrees Celsius and at a humidity of about 85% to about 93%.

4. The window of claim 1, wherein the metal-organic framework includes at least one of an Fe-based metal-organic framework, a Ti-based metal-organic framework, or a Zr-based metal-organic framework.

5. The window of claim 1, further comprising a window functional layer which includes at least one of a hard coating layer or an anti-fingerprint layer.

6. The window of claim 5, wherein the hard coating layer is disposed on the window base layer.

7. The window of claim 5, wherein the anti-fingerprint layer is disposed on the window protecting layer.

8. A window comprising:
a window base layer; and
a window protecting layer disposed on the window base layer,
wherein at least one of the window base layer or the window protecting layer includes a metal-organic framework film,
wherein the metal-organic framework film has a thickness of about 30 micrometers to about 100 micrometers.

9. The window of claim 8, wherein the metal-organic framework film has a modulus of about 10 gigapascals or less.

10. The window of claim 8, wherein the metal-organic framework film has a self-folding characteristic at a temperature of about 60 degrees Celsius to about 85 degrees Celsius and at a humidity of about 85% to about 93%.

11. The window of claim 8, wherein the metal-organic framework film includes at least one of a Fe-based metal-organic framework, a Ti-based metal-organic framework, or a Zr-based metal-organic framework.

12. The window of claim 8, the metal-organic framework film is transparent.

13. A display device comprising:
a display panel;
a window disposed on a first surface of the display panel, the window including:
a window base layer; and
a window protecting layer disposed on the window base layer; and
a panel protecting layer disposed on a second surface of the display panel opposite to the first surface of the display panel,
wherein
at least one of the window base layer, the window protecting layer, or the panel protecting layer includes a metal-organic framework,
wherein the window base layer has a thickness of about 30 micrometers to about 100 micrometers, the window protecting layer has a thickness of about 30 micrometers to about 100 micrometers, and the panel protecting layer has a thickness of about 10 micrometers to about 50 micrometers.

14. The display device of claim 13, wherein at least one of the window base layer or the window protecting layer includes a metal-organic framework.

15. The display device of claim 13, wherein the window protecting layer includes at least one layer.

16. The display device of claim 13, wherein the metal-organic framework has a swelling characteristic at a temperature of about 60 degrees Celsius to about 85 degrees Celsius and at a humidity of about 85% to about 93%.

17. The display device of claim 13, further comprising an adhesive layer disposed between the display panel and the panel protecting layer.

18. The display device of claim 13, further comprising a lower functional layer disposed on a first surface of the panel protecting layer opposite to a second surface of the panel protecting layer on which the display panel is disposed,
wherein the lower functional layer includes at least one of a cushion layer including a resin, or a metal layer including a metal material.

* * * * *